United States Patent [19]

Ogawa et al.

[11] Patent Number: 5,444,337
[45] Date of Patent: Aug. 22, 1995

[54] RADIO FREQUENCY AMPLIFYING APPARATUS

[75] Inventors: Yoshiro Ogawa, Yokohama; Heiji Okutsu, Tokyo; Noriyuki Kobayashi, Ichikawa, all of Japan

[73] Assignee: Kabushiki Kaisha Toshiba, Kawasaki, Japan

[21] Appl. No.: 70,953

[22] Filed: Jun. 4, 1993

[30] Foreign Application Priority Data

Jun. 4, 1992 [JP] Japan ................... 4-144551

[51] Int. Cl.⁶ ............................. H05B 37/02
[52] U.S. Cl. ........................ 315/349; 330/10
[58] Field of Search ............. 315/349, 351, 327, 352; 330/10

[56] References Cited

U.S. PATENT DOCUMENTS 2,158,516 11/1937 McIntosh ................... 315/349

OTHER PUBLICATIONS

Holt "Electronic Circuits Digital and Analog" John Wiley & Sons, Inc. 1978 pp. 545 and 563.
Fusion Engineering and Design 19 (1992), pp. 41–52, S. Moriyama, et al., "Test Results of X2242 and X2274 . . .".
Fusion Engineering and Design 19 (1992), pp. 29–40, K. Uehara, et al., "Plasma Coupling Test of the RF Heating System in JT-60.".
Fusion Technology, vol. 12, Nov. 1987, pp. 449–475, G. Van Oost, et al., "The High-Power (3-MW) Long-Pulse (3-S) Radio-Frequency System . . .".

Primary Examiner—Robert J. Pascal
Assistant Examiner—Michael B. Shingleton
Attorney, Agent, or Firm—Oblon, Spivak, McClelland, Maier, & Neustadt

[57] ABSTRACT

A radio frequency amplifying apparatus including a radio frequency amplifying circuit operative in response to a signal of high frequency wave generated from a source generator includes a switching circuit operatively connected to the source generator and generating an excitation signal in response to the signal from the source generator and a vacuum tube provided with a control grid to which the excitation signal from the switching circuit is inputted. The source generator generates a trigger signal and a switching frequency of the switching circuit is changed by changing a frequency of the trigger signal. An insulation transformer is disposed between the source generator and the switching circuit and a bias power source is connected to the switching circuit.

16 Claims, 9 Drawing Sheets

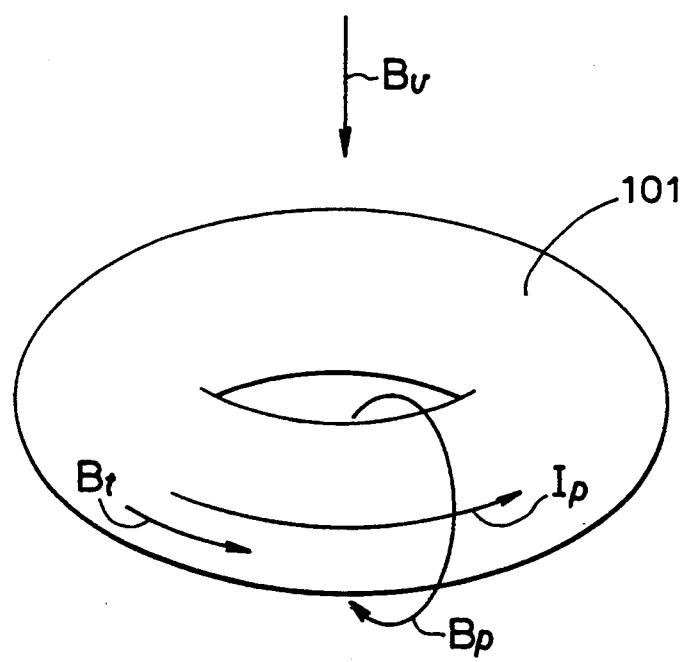
F I G. 10
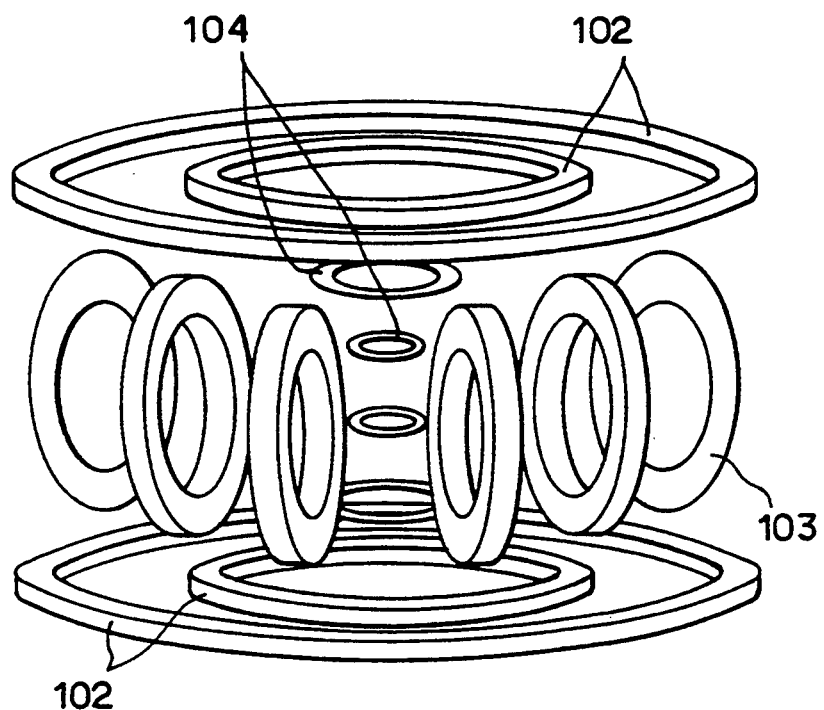
F I G. 11

RADIO FREQUENCY AMPLIFYING APPARATUS

BACKGROUND OF THE INVENTION

The present invention relates to a radio frequency amplifying apparatus to be utilized for a radio frequency heating system for heating and current driving plasma through a supply of radio frequency power to the plasma such as in a tokamak type nuclear fusion system or for an accelerator for accelerating charged particles to high energy particles.

FIG. 10 is a schematic view showing a tokamak type fusion system as a system for confinement of plasma by utilizing a magnetic field, and in such tokamak type fusion system, plasma 101 is confined in shape of torus by a vertical field Bv, a toroidal field Bt in a circumferential direction and a poloidal field Bp created by a plasma current Ip passing inside the torus.

The vertical field Bv is generated, as shown in FIG. 11, by poloidal coils 102 arranged along the torus plasma 101 and the toroidal field Bt is generated by toroidal coils 103 arranged to form a circular solenoid coil means. The plasma current Ip is generated by electromagnetic induction. The plasma current Ip acts to rapidly change current of induction coils 104 arranged at the central portion of the tokamak type fusion system and to induce an electric field in the plasma 101 by time change of the magnetic flux, thereby the plasma current Ip being generated by accelerating electrons by the electric field.

The plasma 101 thus generated in the tokamak type fusion system has temperature merely of about several tens of million degrees as it is, and in order to obtain temperature of about several hundreds of million degrees required for a nuclear fusion reactor, for example, it is necessary to heat the plasma by suitable means. One means for heating the plasma is represented by a so-called ion cyclotron heating method in which a high frequency wave having a frequency synchronized with a turning motion, i.e. cyclotron motion, of ions in the magnetic field is given to cause the frequency resonance and then to apply the high frequency energy to the ions.

FIG. 12 shows a general arrangement of a standard ion cyclotron heating device of the type in which radio frequency power is supplied to four antennas 115. In the ion cyclotron heating device, a small power frequency generated from a source oscillator or generator 110 is divided into four parts and power amplification is carried out by providing phase difference required for the heating of the respective lines by means of phase converters 111. Since the radio frequency power from the source oscillator 110 is very small and it is hence impossible to amplify the power by utilizing a vacuum tube, the power is preliminarily amplified by a pre-amplifier 112 to a suitable level of power and the amplified power is thereafter inputted into a power amplifier 120.

The heating system includes four power amplifiers 120 each being composed of a low power amplifier (LPA) 121, an intermediate power amplifier (IPA) 122 and a high power amplifier (HPA) 123, which amplifies the radio frequency power from 1KW order to MW order.

The radio frequency from the power amplifier 120 is transmitted to the antenna 115 through an impedance matching system (IMS) 114 by way of a transfer line 113. Generally, as an input impedance for the antenna 115 differs from a characteristic impedance, the impedance matching system 114 composed of a stub is arranged on the way of the transfer line 113.

A conventional radio frequency heating system aims mainly to heat the plasma, but recently, there has been studied the radio frequency current driving technology for generating current in the plasma because it becomes possible to pass the current continuously in the plasma of the tokamak type fusion system by utilizing the radio frequency, different from a case of the electromagnetic induction technology. There has been also carried out experiments of the current driving for accelerating electrons by means of the radio frequency in the ion cyclotron heating system. In such case, it is necessary to change the frequency level to that of the heating to avoid absorption of the radio frequency by the ions.

Moreover, in the conventional radio frequency heating apparatus, the electrons are accelerated in one direction. Accordingly, as shown in FIG. 13, when the radio frequency is applied to the plasma from the antenna 115 (115a to 115d, for example), it is necessary to set the phase defference, which is different from that at the time of heating, between the respective antennas 115a to 115d so that travelling waves are formed by the electromagnetic waves. As shown in FIG. 13, the antennas 115a to 115d are connected to the inner conductors 117 and the outer conductors 118 respectively through a return conductor 116.

In the assumption of a future nuclear fusion reactor, it is disadvantageous to separately locate a heating means and a current driving means to the system in view of the reduction of the construction cost and an occupied space, and it is hence significantly required to provide one system which can carry out the heating and current driving operation. In this requirement, it is required for the radio frequency amplifying apparatus to carry out the frequency changing easily with short time.

However, if such system carrying out the heating and current driving operations is to be realized, it will be required to change the frequency and the phase difference during the operation. The phase difference changing is performed by an electronic circuit with relatively short time, but the frequency changing requires relatively much time for the reason described hereunder. Although the radio frequency power has to be stopped during the operation change, the current driving efficiency is extremely lowered by the stopping of the radio frequency power because the temperature of the plasma, particularly the electron temperature, is lowered. For this reason, it is required to make as short as possible the transfer time from the heating mode to the current driving mode.

In spite of the above fact, in order to change the frequency, it is necessary to change not only the oscillation frequency of the source oscillator 110 but also tuning frequencies of output circuits of the respective amplifiers 121, 122 and 123 constructing the power amplifying apparatus 120 as well as the output circuits themselves. For example, with reference to FIG. 14 showing one example of a resonator of the output circuit of the amplifier, there is shown a standard reentrant type cavity resonator 130 in which an inner conductor 131 and an outer conductor 132 are arranged, and when such cavity resonator 130 is utilized, the tuning frequency is changed by changing a distance L by moving a short-circuit plate 133 along the axial direction of the inner and outer conductors 131 and 132.

Accordingly, on the changing of the frequency, a time for moving the short-circuit plate 133 and adjusting the tuning frequency is additionally required. As shown in FIG. 12, in the case of three-stage amplifiers, the tuning must be carried out generally at six portions on the input and output sides, thus requiring much time for the adjustment and hence being inconvenient in operation.

A metallic contact 134 is secured to the short-circuit plate 133 with a constant pressing pressure for ensuring an electric contact, and in general, since a plurality of such metallic contacts 134 are attached along the circumferential direction of the short-circuit plate 133, it is difficult to instantaneously move the short-circuit plate 133 to change the tuning frequency. On the contrary, to make fast the moving speed of the short-circuit plate 133 will damage the contacting performance of the metallic contacts 134, resulting in the lowering of the reliability and shortening of the life time, and in a certain case, some inconvenience may be caused to a driving force generation means for moving the short-circuit plate 133.

SUMMARY OF THE INVENTION

An object of the present invention is to substantially eliminate defects or drawbacks encountered in the prior art and to provide a radio frequency amplifying apparatus having a simple structure capable of easily changing the frequency by incorporating a switching circuit means to a radio frequency amplifying circuit of the apparatus.

This and other objects can be achieved according to the present invention by providing a radio frequency amplifying apparatus including a radio frequency amplifying circuit operative in response to a signal of high frequency wave generated from a source generator, the apparatus comprising:

a switching circuit means operatively connected to the source generator and generating an excitation signal in response to the signal from the source generator; and a vacuum tube provided with a control grid to which the excitation signal from the switching circuit means is inputted.

In preferred embodiments, the switching circuit means is composed of a semiconductor element. The signal generated from the source generator is a trigger signal and a switching frequency of the switching circuit means is changed by changing a frequency of the trigger signal.

The apparatus further comprises means for changing a direct current applying voltage of the switching circuit means to control an output voltage, wherein a width of an output pulse from the switching circuit means is controlled by changing a width of a pulse of the trigger signal and the output power is thereby controlled. The apparatus further comprises a direct current insulation means disposed between the source generator and the switching circuit means and a bias power source connected to the switching circuit means. The direct current insulation means is an insulation transformer and the switching circuit means comprises a metal oxide semiconductor field effect transistor having a gate to which the trigger signal is inputted through the insulation transformer to thereby maintain constant an entire potential of the metal oxide semiconductor field effect transistor.

The radio frequency amplifying apparatus further comprises a trigger signal distributor for dividing the trigger signal into two parts having a phase difference of 180° from each other and the switching circuit means includes at least one ON signal element for controlling a starting timing of the output frequency wave of the switching circuit means and at least one OFF signal element for controlling a switch-off timing thereof, the ON and OFF signal elements being connected in series, so that the output frequency wave is inputted from an intermediate portion between the ON and OFF signal elements to the control grid of the vacuum tube as an excitation signal.

The switching circuit means may include a plurality of ON signal elements and a plurality of OFF signal elements each in direct-parallel connection.

An output end of the switching circuit means is directly connected to an input electrode of control grid of the vacuum tube.

A switching frequency of the switching circuit means is made to be one n-th (n: natural number) of a predetermined output frequency.

According to the radio frequency amplifying apparatus of the present invention of the characters described above, the input signal for the excitation of the vacuum tube is generated from the switching circuit, so that any vacuum tube for the prestage amplification is not needed for the provision of the vacuum tube for the amplification of large power can be directly excited, whereby there is no need for the multistage amplification and the location of an input tuning circuit is also eliminated, which is required in the prior art technology.

Accordingly, the structure of the amplifying apparatus is itself made simple and the reliability of the apparatus can be thus improved, resulting in the shortening of the frequency changing operation working time.

The nature and features of the present invention will be made further clear hereunder by way of descriptions of preferred embodiments in conjunction with the accompanying drawings.

BRIEF DESCRIPTION OF THE DRAWINGS

In the accompanying drawings:

FIG. 10 shows a brief model of a general tokamak plasma;

FIG. 11 is a perspective view showing a coil arrangement of the tokamak type fusion system;

DESCRIPTION OF THE PREFERRED EMBODIMENTS

A first embodiment of a radio frequency amplifying apparatus according to the present invention will be described hereunder with reference to its basic structure shown in FIG. 1.

Figure 12:
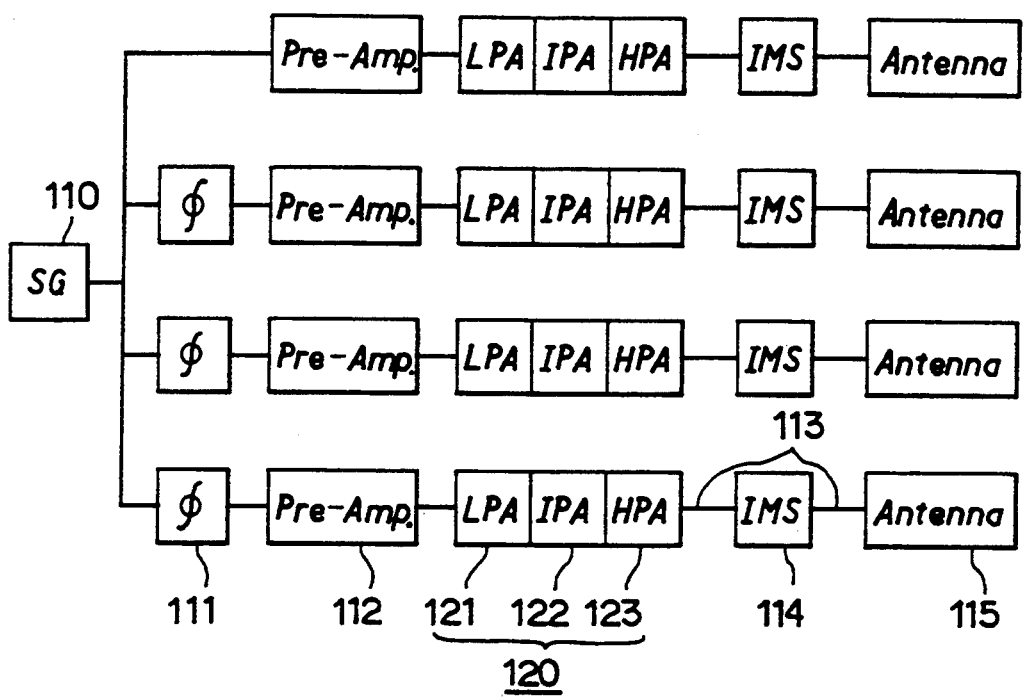
FIG. 12 is a block showing an arrangement of a conventional standard ion cyclotron heating system.
Figure 13:
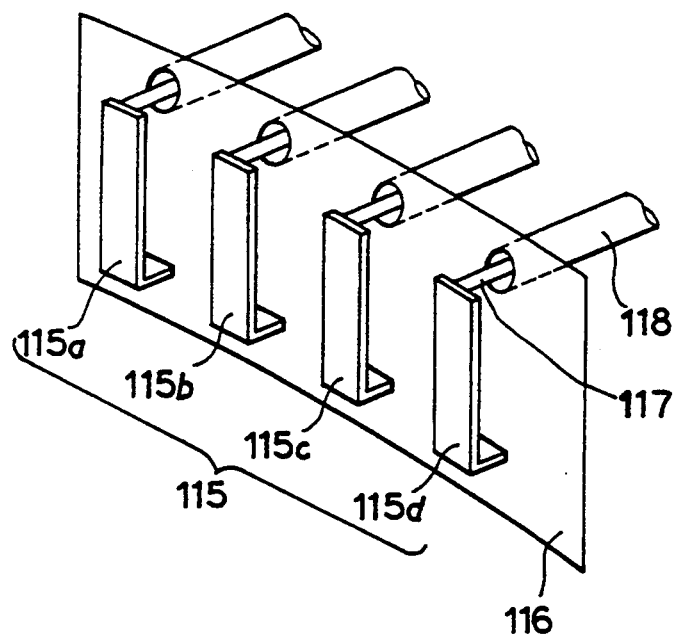
FIG. 13 is a perspective view of an antenna device utilized for the ion cyclotron heating system of FIG. 12.
Figure 14:
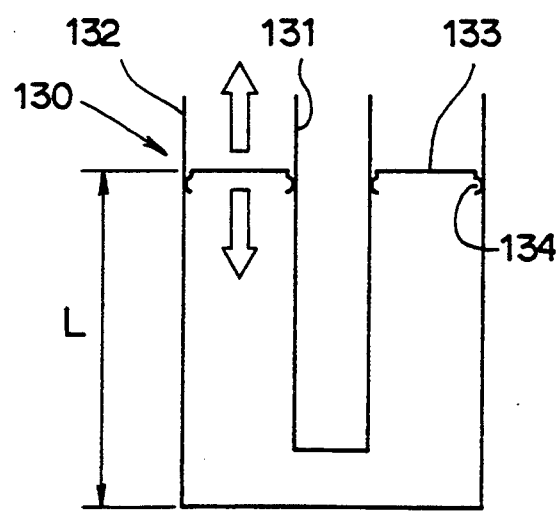
FIG. 14 is a schematic view of one example of a cavity resonator utilized for an output tuning circuit of an power amplifier.

The illustrated first embodiment shows an example which is applied to a cathode grounded type amplifier circuit utilizing a tetrode, i.e. four electrode tube, and the basic structure thereof is substantially identical to that shown in FIG. 12, as an amplifying apparatus, except that prestage amplifying elements such as pre-amplifier 112, the low power amplifier 121 of the power amplifying device 120 and the intermediate power amplifier 122 are substituted with a switching circuit 2, which constitutes a significant difference in structure.

Namely, the radio frequency amplifying apparatus 1 of the present embodiment is equipped with the switching circuit 2 and a vacuum tube 3, in which a trigger signal TS from a source oscillator or generator 4 is applied to the switching circuit 2 and an output from this switching circuit 2 is directly inputted into a control grid CG of the tube 3.

Figure 2:
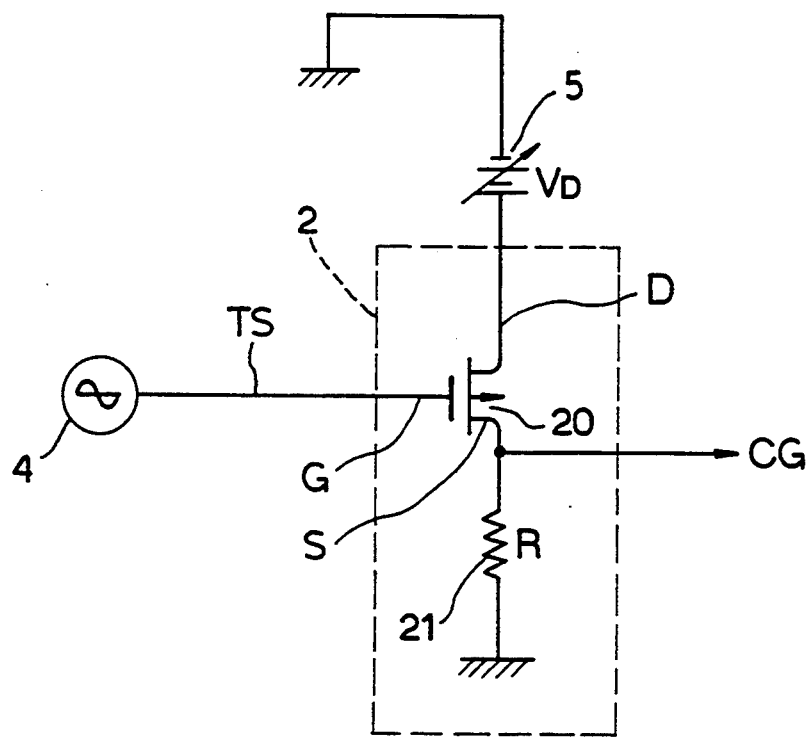
FIG. 2 shows a switching circuit of the first embodiment of FIG. 1.

For example, a MOSFET (metal oxide semiconductor field effect transistor) 20 shown in FIG. 2 may be utilized for the switching circuit 2. The MOSFET 20 has a drain portion D to which a DC source 5 is connected and a source S grounded through a resistor 21. The trigger signal TS from the source oscillator 4 is inputted into a gate G of the MOSFET 20 and an excitation input to the control grid CG of the tube 3 is taken out of the source S.

The embodiment of the above structure will operate as follows.

According to the radio frequency amplifying apparatus 1 of the present embodiment, the source oscillator 4 generates a radio frequency signal of small power as trigger signal TS to the switching circuit 2 to carry out on-off switching of the DC voltage applied from the DC power source 5. In synchronism with this operation, a current passes the resistor 21 of the MOSFET 20, thus creating an electric potential between both ends of the resistor 21.

Accordingly, the frequency of the output of the switching circuit 2 is the same as that of the source oscillator 4 and the switching circuit 2 can thus generate an excitation input signal ES having a voltage necessary for the excitation of the tube 3. Further, since the output end of the switching circuit 2 is directly connected to the control grid CG of the tube 3, the excitation input signal ES can be amplified to a large power of such as 1MW by controlling the electron flow towards an anode P from a cathode K by means of the control grid CG.

As described above, according to this embodiment, since any prestage amplifying means having a tuning circuit is not used, the entire structure of the apparatus can be made compact. The tuning working at the frequency changing can be made only for the output cavity of the tube 3 at the final location, thus remakably shortening the time required for the frequency changing operation. Furthermore, the output can be changed by changing the voltage $V_D$ of the DC power source 4 and a wave control of an output pulse can be also made.

Figure 3:
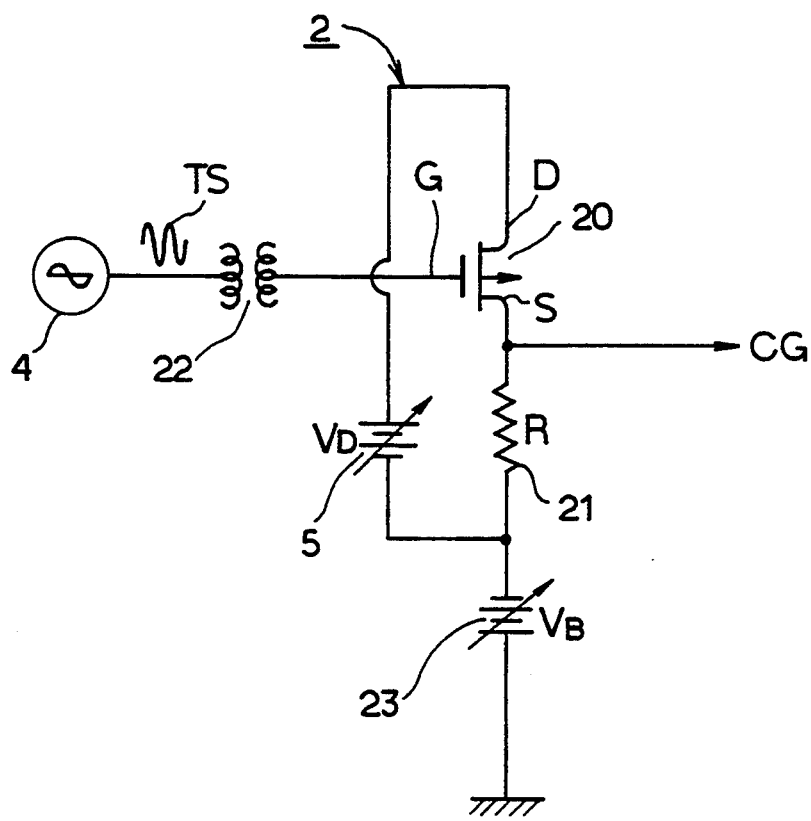
FIG. 3 shows a circuit for biasing a switching circuit according to a second embodiment of the present invention.

FIG. 3 shows a second embodiment of the radio frequency amplifying apparatus according to the present invention in which like reference numerals are added to elements or members corresponding to those of the first embodiment.

In this second embodiment, a constant bias voltage $V_B$ is applied to the switching circuit 2, an insulation transformer 22 is connected between the source oscillator 4 and the switching circuit 2, and a bias power source 23 is connected to the gate G of the MOSFET 20 through the resistor 21.

According to the second embodiment of the structure described above, the trigger signal TS from the source oscillator 4 is inputted into the gate G of the MOSFET 20 of the switching circuit 2 through a DC insulating portion of the insulation transformer 22 and the bias voltage $V_B$ is applied by the bias power source 23 incorporated on the side of the source S, thus maintaining constant the potential of the entire switching circuit 2.

Figure 4A:
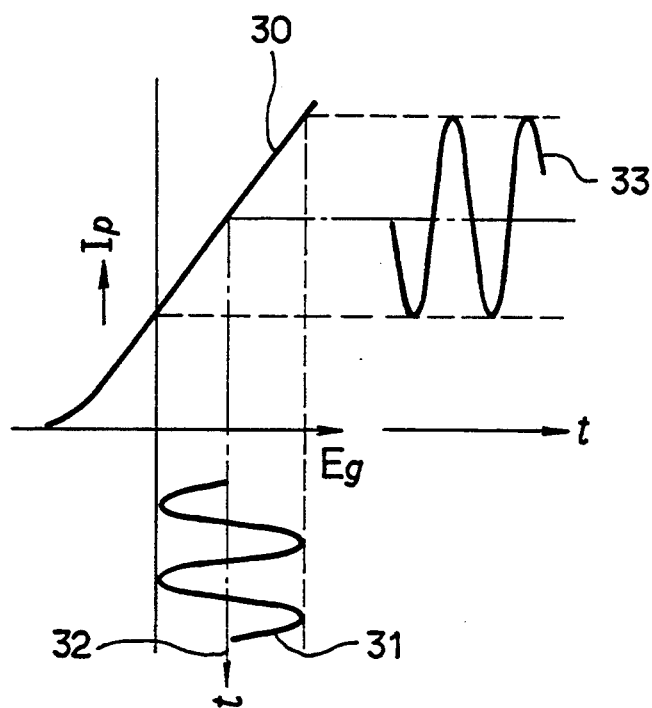
FIG. 4A and FIG. 4B are views for the explanatory of the changes of the amplifications according to the changes of bias voltages.
Figure 4B:
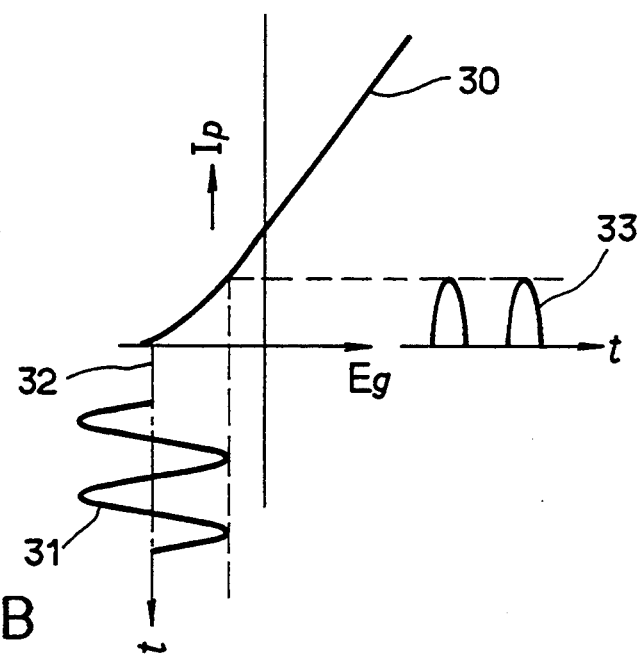

Accordingly, an amplified condition of the tube 3 can be changed, as represented by the characteristic curves 30 of a grid voltage $E_g$ and an anode current $I_p$ as shown in FIGS. 4A and 4B, by changing the bias voltage $V_B$ of the bias power source 23. The graphs of FIGS. 4A and 4B show how the anode currents $I_p$ change the anode current waves 33 by changing central voltages 32 of excitation inputs 31.

In the case of 0 V (zero voltage) of the bias voltage $V_B$, the amplification becomes so-called "A" class amplification as shown in FIG. 4A, and on the other hand, when the central voltage 32 is positioned at a position of $I_p=0$ as shown in FIG. 4B by applying the bias voltage $V_B$, the amplification becomes "C" class amplification.

As described above, according to this embodiment, it becomes possible to drive the tube 3 with high efficiency by changing the bias voltage $V_B$, and hence, a radio frequency amplifying apparatus having high energy converting efficiency can be provided. Furthermore, an output level can be also controlled by changing the bias voltage $V_B$.

Figure 5:
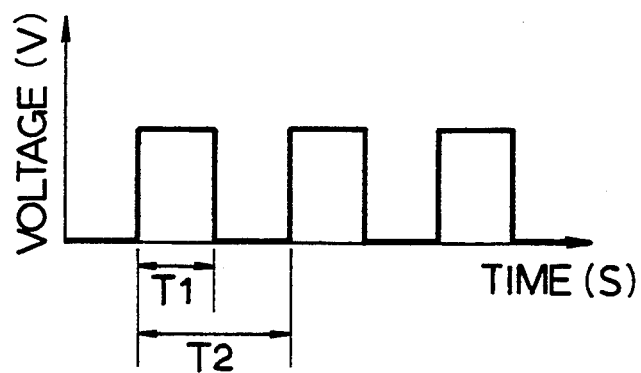
FIG. 5 shows a wave shape of a trigger signal of rectangular shape.

Further, in the radio frequency amplifying apparatus of the structure described above, in a case shown in FIG. 5 in which the trigger signal TS is composed of rectangular pulse train, a high driving efficiency likely in the case of the "C" class amplification can be realized by making short a pulse width T1 to that less than half of one cycle T2. Since the mean value of the anode current $I_p$ is changed by changing the pulse width T1, the output level can be controlled.

Figure 6:
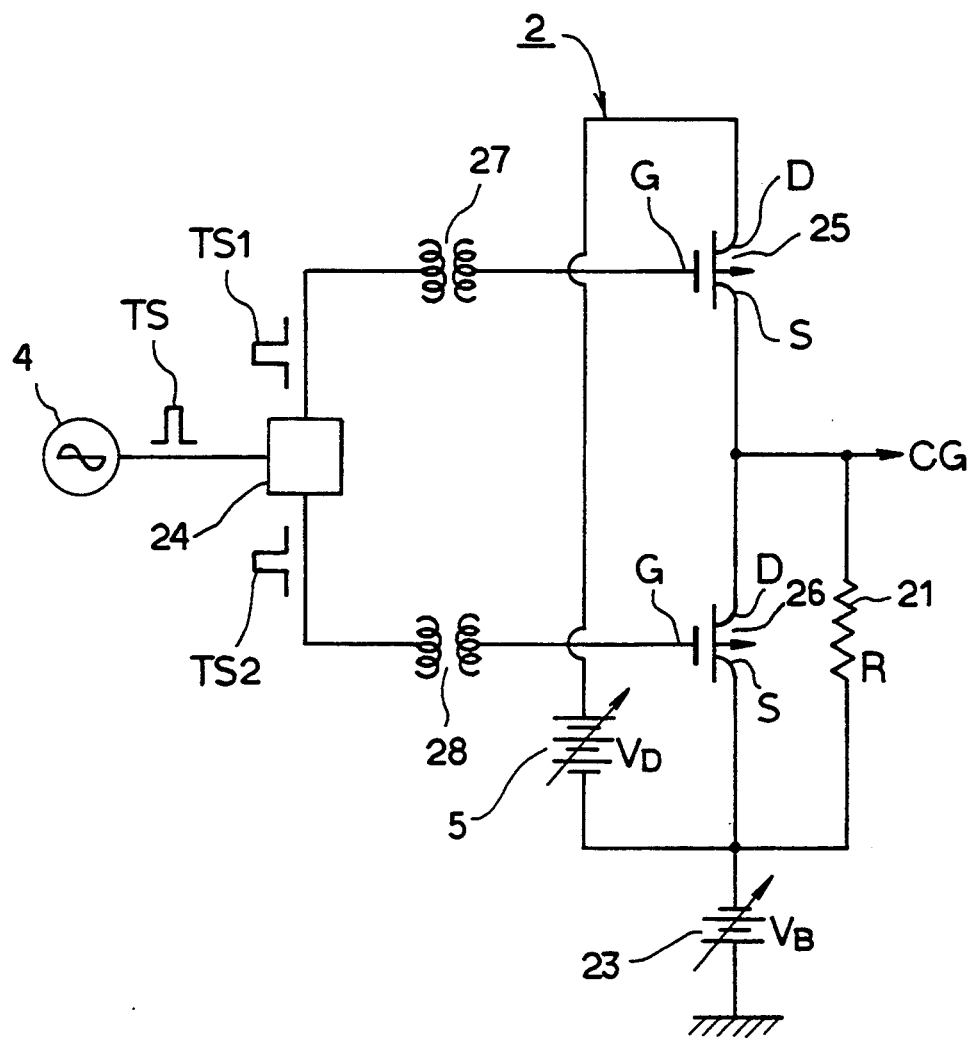
FIG. 6 shows a switching circuit of a radio frequency amplifying apparatus of a third embodiment of the present invention.

FIG. 6 represents a third embodiment of the radio frequency amplifying apparatus according to the present invention, in which like reference numerals are added to elements or members corresponding to those of the first embodiment.

Figure 7:
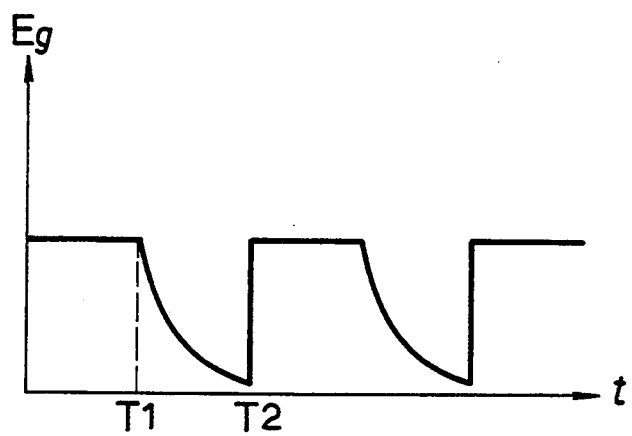
FIG. 7 shows a wave shape of a deformed excitation input wave.

This third embodiment represents an example in which the frequency of the used radio frequency wave becomes high and, hence, influence of the electrostatic capacity of the control grid CG itself of the tube 3 cannot be ignored. Namely, when the frequency becomes high, much time is required for discharging electric charges accumulated to the electrostatic capacity of the control grid CG itself, thereby the output power wave shape from the switching circuit 2 being deformed from the rectangular shape to a trailing shape as shown in FIG. 7. This phenomenon constitutes a significant defect for the high efficiency driving in the "C" class amplifying operation.

In order to avoid such defect, according to this third embodiment, as shown in FIG. 6, the trigger signal TS from the source generator or oscillator 4 is divided and distributed into two components by means of a trigger signal distributor 24 with, for example, phase difference of 180° from each other as on-trigger signal TS1 and off-trigger signal TS2, and accordingly, an on-signal element 25 adapted to control a start timing of the output wave of the switching circuit 2 and an off-signal element 26 adapted to control a finishing timing of the output wave. The source S for the on-signal element 25 and the drain D for the off-signal element 26 are directly connected and an excitation input to be applied to the control grid CG of the tube 3 is taken out of this connecting portion. The voltage $V_D$ of the DC power source 5 is applied to the drain D of the on-signal element 25. The on-signal element 25, the off-signal element 26 and the DC power source 5 are potentially biased by the bias power source 23. Two trigger signals TS1 and TS2 are connected to the gates G of the signal elements 25 and 26 respectively through the insulation transformers 27 and 28.

The third embodiment of the structure described above operates as follows.

At the starting time of the output wave of the switching circuit 2, only the on-signal element 25 is operated in an enabling state by the On-trigger signal TS1 and the voltage $V_D$ of the DC power source 5 is applied to the control grid CG by an amount corresponding to the time width of the trigger signal TS. Next, the off-signal element 26 is operated by the off-trigger signal TS2 to thereby forcibly discharge the charge accumulated in the control grid CG.

Figure 8:
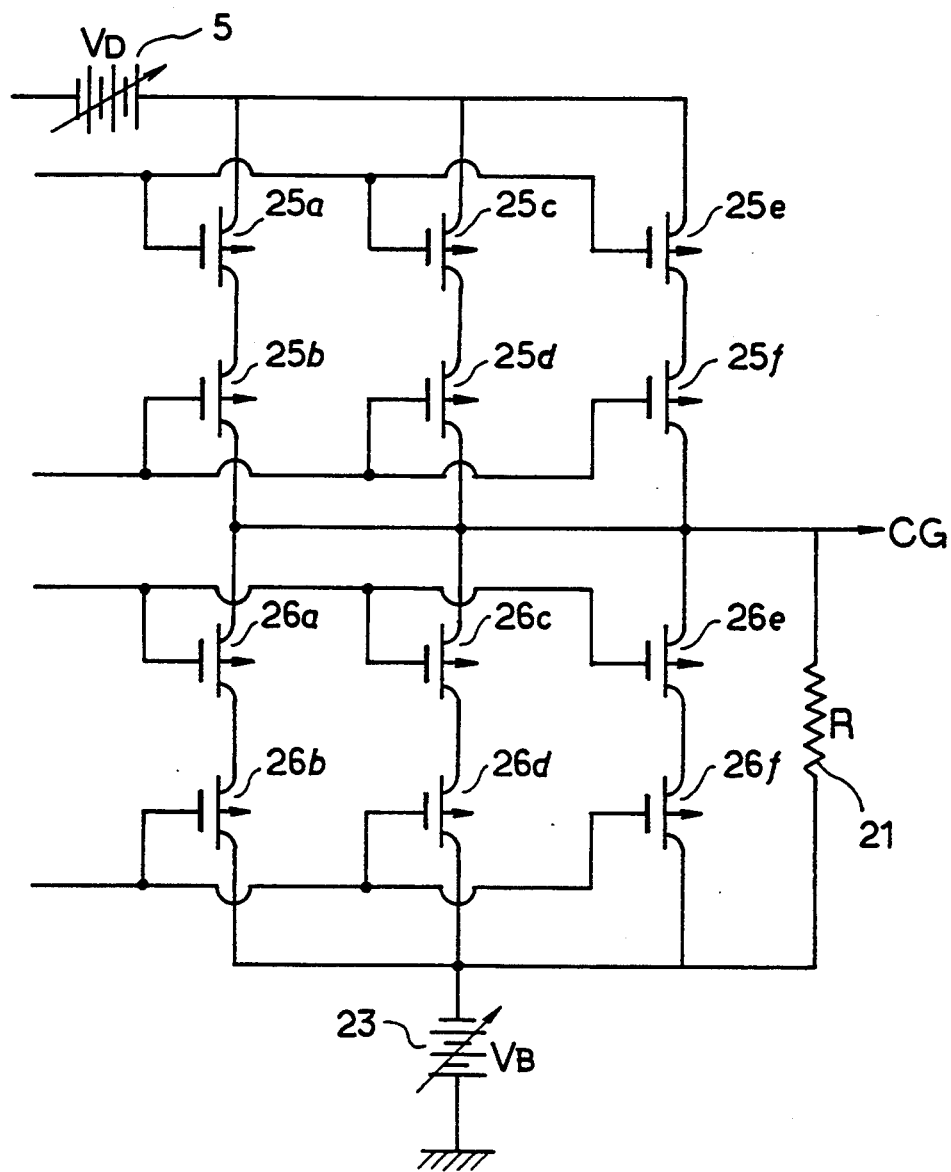
FIG. 8 shows a circuit arrangement of a switching elements in the case of a large excitation input.

According to these operations, the trailing waves shown in FIG. 7 can be eliminated from the excitation input waves and the frequency such as of several tens MHz can be amplified with high efficiency without deforming the shapes of the output waves from the switching circuit 2. In a case where a large excitation input is required, a plurality of on-signal elements and off-signal elements will be arranged such as shown in FIG. 8, in which the on-signal elements 25a to 25f and off-signal elements 26a to 26f are disposed in series-parallel arrangements.

FIG. 9 represents a fourth embodiment of the radio frequency amplifying apparatus according to the present invention, in which like reference numerals are added to elements or members corresponding to those of the first embodiment.

Figure 1:
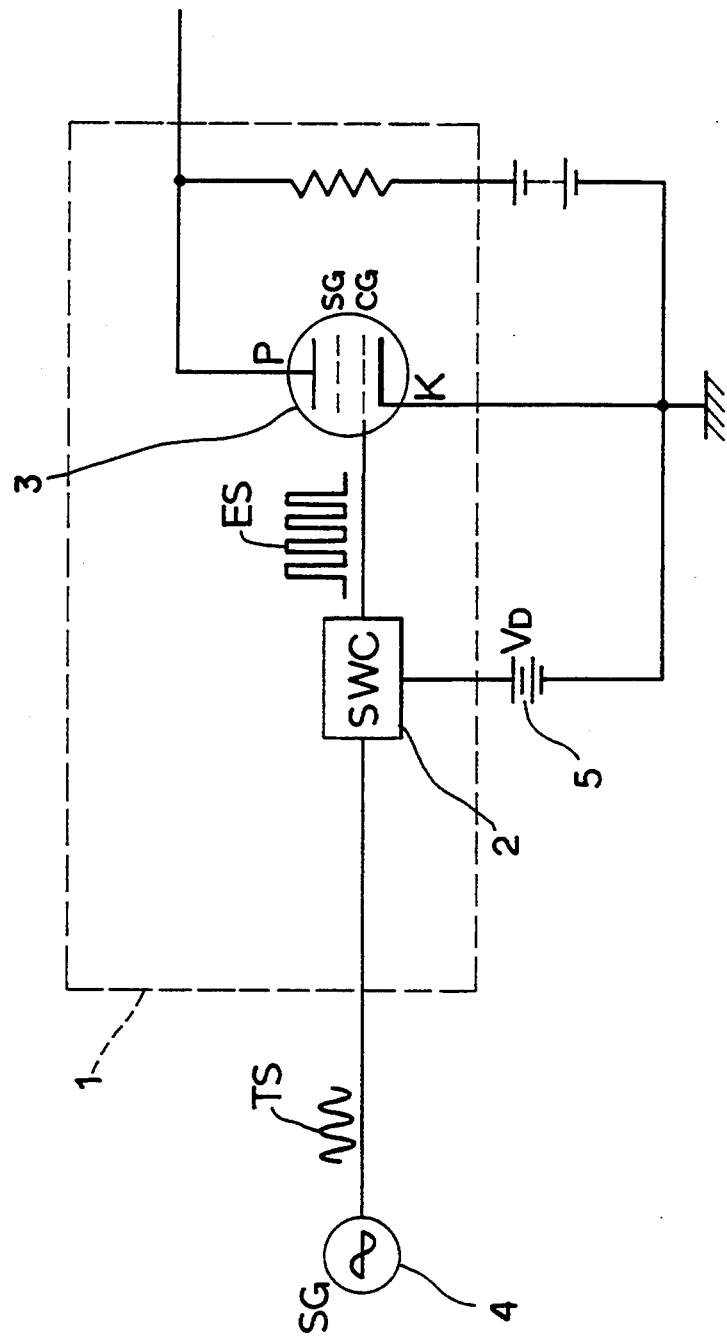
FIG. 1 is a circuit arrangement of a radio frequency amplifying apparatus of a first embodiment of the present invention.

The fourth embodiment of FIG. 9 includes the basic circuit structure of FIG. 1 and when the frequency of the output of the tube 3 is denoted as f1, the frequency of the excitation input is generally denoted also as f1. However, in a case where radio frequency characteristics of the inputs of the switching circuit 2 and the control grid CG are not ensured sufficiently high for the excitation of the frequency f1, the excitation input can be amplified by natural times by utilizing the frequency of 1/n time (n: natural number) of the direct frequency f.

Figure 9A:
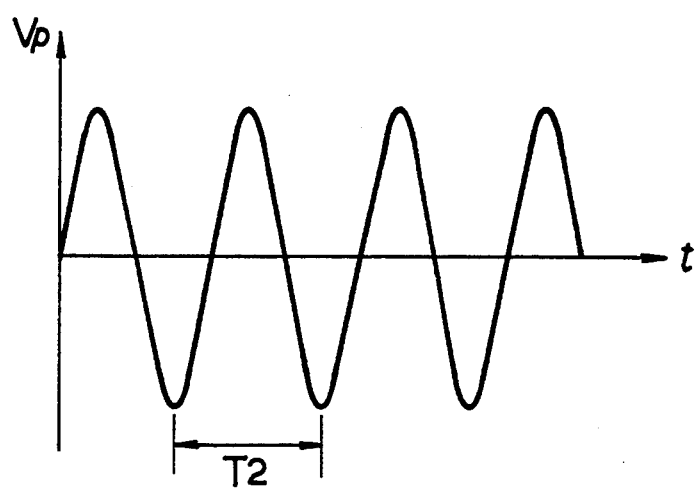
FIG. 9A and FIG. 9B show wave shapes of signals for the excitation in a fourth embodiment of the radio frequency amplifying apparatus of the present invention.
Figure 9B:

For example, as shown in FIG. 9A, the excitation input with respect to the high frequency having output waves of period T2 has half (½) frequency of period 2T2 twice of the period T2 as shown in FIG. 9B. Accordingly, the radio frequency amplification of about 100 MHz can be realized without being limited by the frequency characteristics of the switching element input and the excitation input, thus enabling the easy manufacturing and adjustment.

As described hereinabove, according to the radio frequency amplifying apparatus of the present invention, there is provided an excitation input of a vacuum tube for large power amplification by a location of a switching circuit, and accordingly, a structure of the amplifying apparatus can be extremely made simple and the operational reliability thereof can be improved. The frequency changing operation can be also simplified, thus shortening the working time.

What is claimed is:

1. A radio frequency amplifying apparatus including a radio frequency amplifying circuit operative in response to a signal of radio frequency wave generated from a source generator, comprising:

a switching circuit means operatively connected to the source generator and generating an excitation signal in response to the signal from the source generator, said switching circuit means comprising a semiconductor element; and a vacuum tube provided with an excitation input portion to which the excitation signal from the switching circuit means is inputted, said excitation input portion including a control grid of the vacuum tube to which said switching circuit means is directly connected.

2. A radio frequency amplifying apparatus according to claim 1, wherein said switching circuit means is composed of a semiconductor element.

3. A radio frequency amplifying apparatus according to claim 2, wherein said semiconductor element is a field effect transistor.

4. An apparatus according to claim 2, wherein said vacuum tube is an only vacuum tube of said apparatus within a power amplifier of said apparatus.

5. A radio frequency amplifying apparatus according to claim 1, wherein the signal generated from the source generator is a trigger signal and wherein a switching frequency of the switching circuit means is changed by changing a frequency of the trigger signal.

6. A radio frequency amplifying apparatus according to claim 5, further comprising means for changing a direct current applying voltage of the switching circuit means to control an output voltage.

7. A radio frequency amplifying apparatus according to claim 6, wherein a width of an output pulse from the switching circuit means is controlled by changing a width of a pulse of the trigger signal and the output power is thereby controlled.

8. A radio frequency amplifying apparatus according to claim 5, further comprising a direct current insulation means disposed between the source generator and the switching circuit means and a bias power source connected to the switching circuit means.

9. A radio frequency amplifying apparatus according to claim 8, wherein said direct current insulation means is an insulation transformer and said switching circuit means comprises a metal oxide semiconductor field effect transistor having a gate to which the trigger signal is inputted through the insulation transformer to thereby maintain constant an entire potential of the metal oxide semiconductor field effect transistor.

10. A radio frequency amplifying apparatus according to claim 9, wherein an output power is controlled by changing a voltage of the bias power source for the switching circuit means.

11. A radio frequency amplifying apparatus according to claim 9, further comprising means for dividing the trigger signal into two parts having phase difference of 180° from each other and wherein said switching circuit means includes at least one ON signal element for controlling a starting timing of the output frequency wave of the switching circuit means and at least one OFF signal element for controlling a switch-off timing thereof, said ON and OFF signal elements being connected in series, so that the output frequency wave is inputted from an intermediate portion between the ON and OFF signal elements to the excitation input portion of the vacuum tube as an excitation signal.

12. A radio frequency amplifying apparatus according to claim 11, wherein said trigger signal dividing means is composed of a trigger signal distributor disposed between the source generator and the switching circuit means.

13. A radio frequency amplifying apparatus according to claim 11, wherein said ON signal element has a source and said OFF signal element has a drain which is directly connected to the source of the ON signal element.

14. A radio frequency amplifying apparatus according to claim 11, wherein said switching circuit means includes a plurality of ON signal elements and a plurality of OFF signal elements each in direct-parallel connection.

15. An apparatus according to claim 4, further comprising:
means, connected to said vacuum tube, for generating plasma using said signal output from said vacuum tube.

16. A radio frequency amplifying apparatus according to claim 1, wherein a switching frequency of the switching circuit means is made to one n-th (n: natural number) of a predetermined output frequency.

* * * * *